United States Patent [19]

Grubb

[11] 4,017,954

[45] Apr. 19, 1977

[54] TOOL FOR GANG CRIMPING RIBBON COAXIAL CABLE

[75] Inventor: Daniel Baker Grubb, Hummelstown, Pa.

[73] Assignee: AMP Incorporated, Harrisburg, Pa.

[22] Filed: Sept. 22, 1975

[21] Appl. No.: 615,273

[52] U.S. Cl. .................................... 29/749; 29/751

[51] Int. Cl.[2] .................. H01R 43/00; H05K 13/06

[58] Field of Search ....... 29/203 MW, 203 DT, 203 HT,
29/203 H, 203 HC, 628, 630 R, 630 A, 203 P, 203 J

[56] References Cited

UNITED STATES PATENTS

| | | | |
|---|---|---|---|
| 3,742,571 | 7/1973 | Brehm | 29/203 H |
| 3,859,724 | 1/1975 | Folkenroth | 29/628 |
| 3,864,802 | 2/1975 | Tucci | 29/203 MW |
| 3,866,294 | 2/1975 | McCaughey | 29/203 H |

*Primary Examiner*—James R. Duzan
*Attorney, Agent, or Firm*—Allan B. Osborne

[57] ABSTRACT

This invention relates to a tool and the method for terminating a plurality of parallel conductors such as are found in a ribbon coaxial cable. More particularly, the invention discloses a tool having a stationary platform on which a multi-contact connector is positioned and a movable member containing wire stakers which drive half of the conductors in the cable into the wire-in-slot contacts simultaneously.

1 Claim, 4 Drawing Figures

FIG. 3
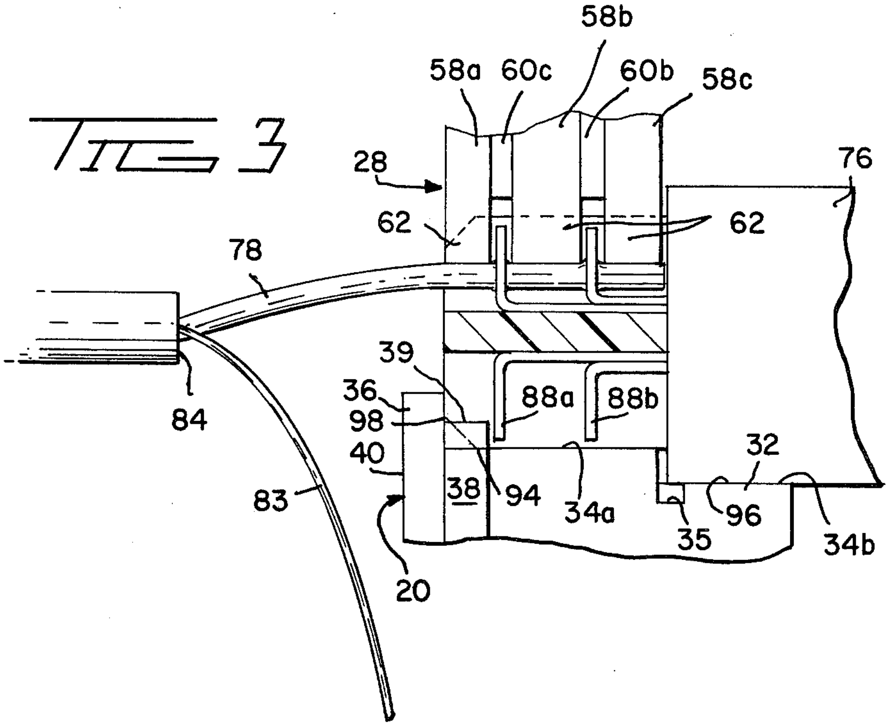
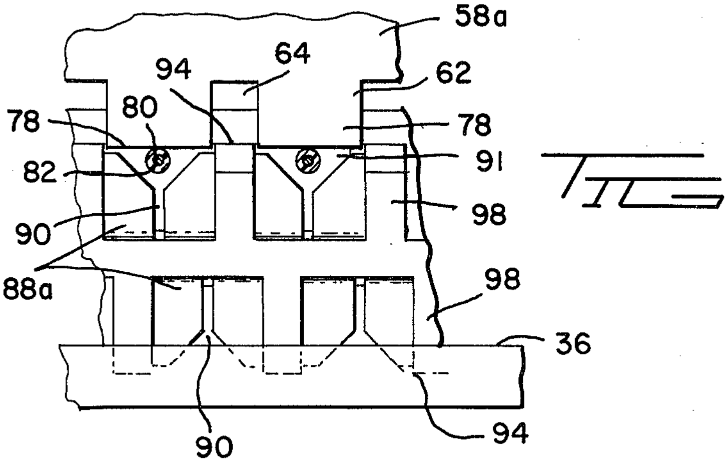
FIG. 4

TOOL FOR GANG CRIMPING RIBBON COAXIAL CABLE

BACKGROUND OF THE INVENTION

1. Field of the Invention

The simultaneous terminating of a ribbon coaxial cable containing a plurality of parallel conductors.

2. Description of the Prior Art

Ribbon coaxial cables of the type having center conductors and parallel drain wires are a recent development such that there is no art known to applicant for the gang or simultaneous terminating thereof.

SUMMARY

The invention provides a tool having a stationary platform on which the multi-contract connector is positioned and a movable member containing means therein which stake the plurality of conductors into the wire-in-slot contacts simultaneously.

The principle object of the invention is to provide a tool which simultaneously terminates a plurality of conductors of a ribbon coaxial cable into a multi-contract connector.

BRIEF DESCRIPTION OF THE DRAWINGS

FIG. 3 is a cross-sectional view of the rear portion of the connector, the cable and the movable and stationary assemblies of the tool of FIG. 1; and FIG. 4 is a frontal view taken along lines 4—4 in FIG. 3.

DESCRIPTION OF THE PREFERRED EMBODIMENT

Figure 1:
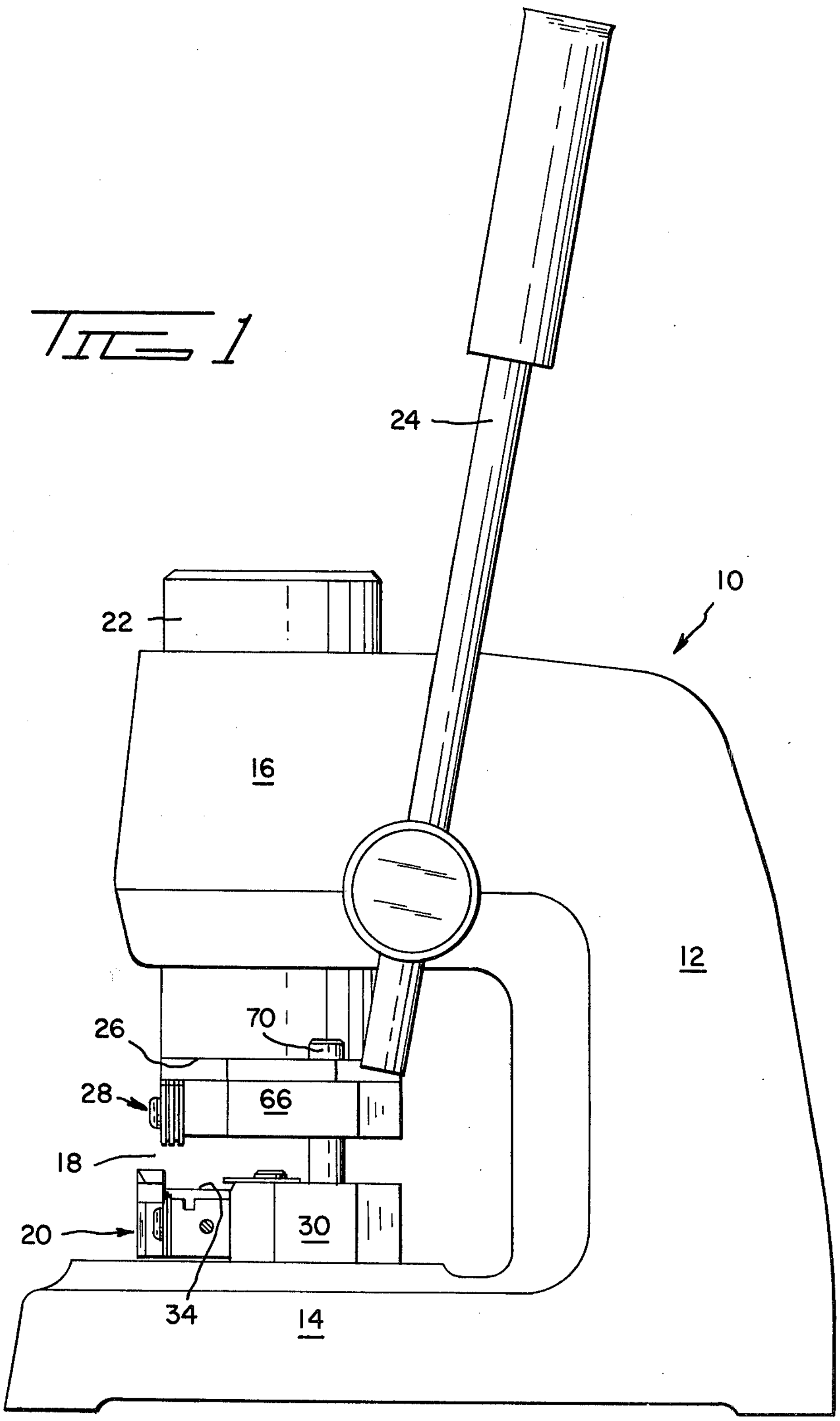
FIG. 1 is a view of a hand operated tool for gang crimping ribbon coaxial cable.

The hand operated tool 10 shown in FIG. 1 is but one type of mechanism which can be used in practicing the present invention. The tool has a C-shaped frame 12 so as to provide a base 14, an upper support member 16 and a work space 18 inbetween. The base 14 provides a support for the stationary assembly 20 of the invention while the upper support member 16 accommodates a movable ram 22, ram-actuating handle 24 and the mechanism (not shown) connecting the two. These types of mechanism; i.e., the frame, ram and handle, are well known in the industry and do not per se form a part of this invention. The base 26 of ram 22 carries the movable assembly 28 of the invention.

Figure 2:
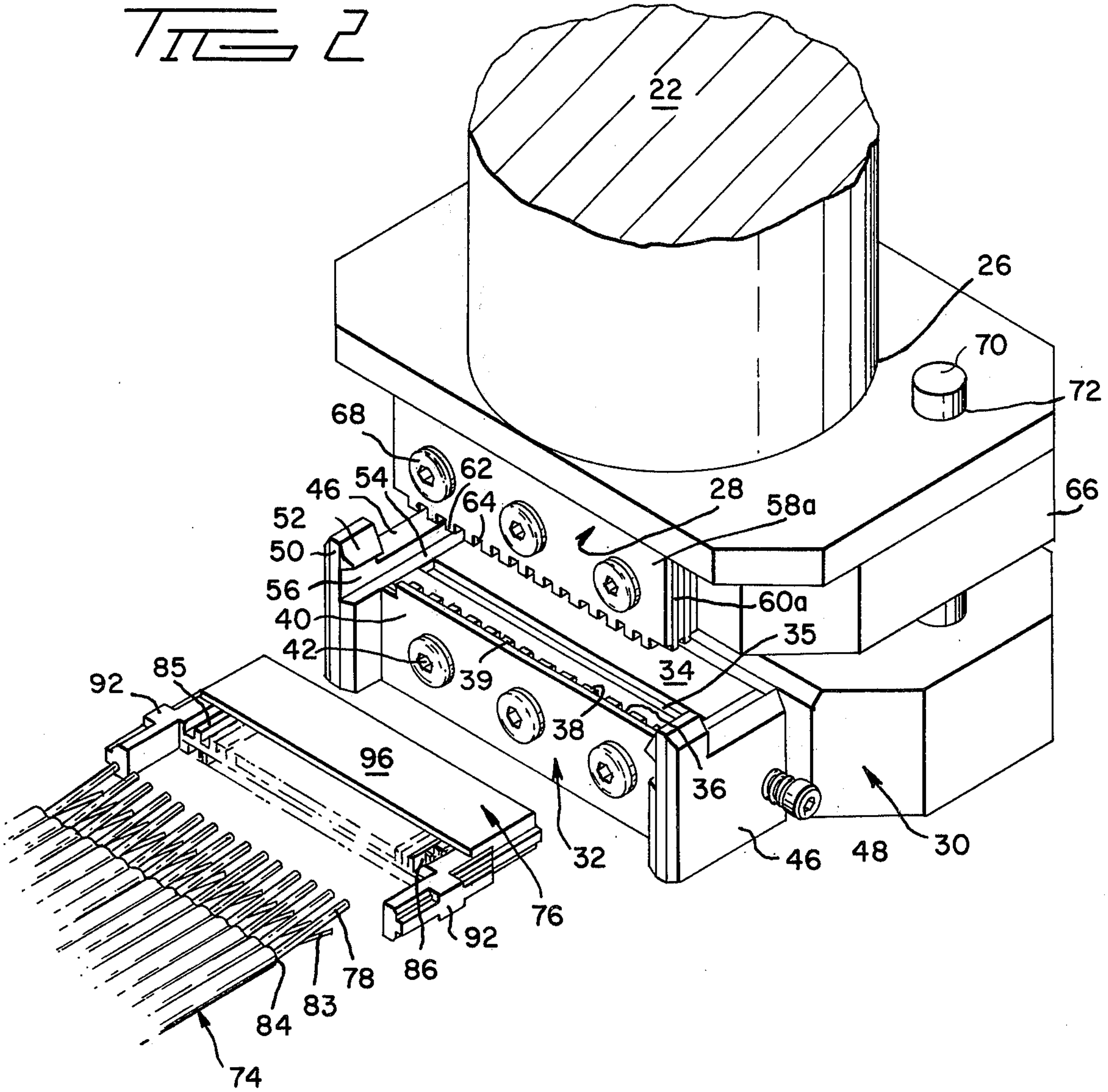
FIG. 2 is a perspective view of a portion of the tool of FIG. 1 and of the multi-contract connector and of the ribbon coaxial cable to be terminated by the tool into the connector.

With reference to FIG. 2 as well as FIG. 1, the stationary assembly 20 includes a lower housing block 30 and a housing stop 32 positioned in front of the block. The lower housing block is secured to the base 14 of the tool 10 by means of bolts (not shown). The housing stop 32 has a platform 34 which is much more wider than long. The platform is divided into a first level **34*a* and a second lower level 34*b*. A groove 35 may separate the two. A pair of ribs 36 and 38, one immediately next to the other, extend along the width of the front edge 40 of the stop 32. The second rib 38 does not extend upwardly above platform 34 as much as the first rib 36 and it contains a plurality of teeth 39. These two ribs can be seen quite clearly in FIG. 3. The three bolts 42 seen on the front of the housing stop secures the ribs and housing stop to the lower housing block. Groove 35** provides room for flash which may be present on the connector.

Retaining means 46 are positioned on either side of the housing stop 32 and secured there by means of spring-biased bolts 48. A rectangular post 50 projects upwardly from the front portion of each locator to provide support for an inwardly projecting ear 52. An upwardly-facing ledge 54 is spaced below the ear so that the two structures define a lateral groove 56 extending rearwardly for a short distance.

The movable assembly 28 includes three staker plates **58*a*, *b* and *c* and two spacer plates 60*a* and *b*. One spacer plate is positioned between staker plates 58*a* and 58*b* and the other spacer plate is between 58*b* and 58*c*. This arrangement is shown clearly in FIG. 3. Each staker plate has a plurality of teeth 62 with spaces 64 inbetween depending downwardly and extending across the width thereof. The plates 58 and 60 are attached to the upper housing block 66 by means of bolts 68**.

FIGS. 1 and 2 show dowel pins 70 which are fixed in lower housing block 30 and project up through openings 72 in the upper housing block 66. These pins prevent lateral movement of the movable assembly 28.

The ribbon coaxial cable and the multi-contact connector designed for the cable are shown to the left in FIG. 2 and are numbered 74 and 76 respectively. The ribbon coaxial cable is disclosed in U.S. Pat. No. 3,775,552. The connector is disclosed in U.S. Pat. No. 3,864,011. With respect to cable 74, it contains a plurality of signal wires 78, each comprising a center conductor 80 and a dielectirc 82 surrounding the conductor (FIG. 4). A metal sheath (not visable in these drawings) surrounds each dielectirc with an uninsulated drain wire 83 being in direct contact therewith. A tough outer insulating jacket 84 surrounds each sheath-drain wire.

The multi-contract connector 76 contains an upper and lower row of cavities which are open at both ends of the connector, with a covering 96 over only the forward portion of the cavities to provide vertical contact openings 85. The front openings (not shown) permit mating with a male terminal such as posts and the contact opening 85 permit terminating conductors 78 and drain wires 84. Each cavity contains an identical wire-in-slot contact 86, the front end (not shown) being adapted to receive a male terminal and the back end 88 having redundant blades **88*a* and 88*b*, each with a slot 90 (see FIGS. 3 and 4) having a wide entrance 91. As FIGS. 3 and 4 show, the cavities and contacts in one row are upside down with respect to the cavities and contacts in the other row. Further the density of the cavities and spacing are the same as the density and spacing of the wires in the ribbon coaxial cable. Strain-relief retaining means 92** extend along either side of the connector.

The method used in gang crimping the ribbon coaxial cable 74 in the multi-contact connector 76 requires that the insulating jacket 84 and metal sheath be removed from the end of the cable so as to expose a length of wires 78 and 83 as shown in FIGS. 2 and 3. Using a comb (not shown) or by hand, all the drain-wires 83 are dressed either upwardly or downwardly and all the signal wires 78 are dressed in the opposite direction. The result is not unlike that of a hand with the fingers straightened out and projecting obliquely upwardly or downwardly.

With the moving assembly 28 at its uppermost position, a connector 76 is slid onto the stationary assembly 32 so that the walls defining the cavities, indicated by reference numeral 94 in FIG. 4, lay inbetween teeth 39 on rib 38 and the end of these walls, reference numeral 98, abut rib 36. The covering 96 rests on the lower level 34*b* of housing stop 32. The grooves 56 on the locators 46 admit the laterally projecting strain-relief retaining means 92. Ears 52 on support posts 50 on the locators restrain the connector against upward movement.

One set of dressed wires; in FIG. 3 the signal wires 78, are inserted into the upwardly facing wide openings 91 in the blades 88*a* and 88*b*. As the number of wires and their spacing is the same as the number of contacts and their spacing, each wire is in alignment with a blade and its slot 90. Holding the ribbon cable with one hand, the operator draws handle 24 on tool 10 forward, bringing ram 22 and its attached movable assemble downwardly. The teeth 62 on staker plates 58*a*, 58*b* and 58*c* bear against the wires 78. FIG. 4 illustrates the condition where the teeth have just contacted wires 78. As the wires are driven downwardly into the slots 90, the edges of the slots cut through the insulation 82 and make contact with the center conductors 80. The space plates 60*a* and 60*b* are positioned so that the blades 88*a* and 88*b* are bracketed but otherwise untouched by the descending staker plates teeth. FIG. 3 illustrates the bottoming-out of ram 22 and movable assembly 28. The frontal view of FIG. 4 shows the spaces 64 between teeth 62 providing room for the walls 94 defining the cavities in connector 76.

The ram 22 and movable assembly 28 can now be returned to the pre-crimping location and the connector 76, with the signal wires 78 terminated to one row of contacts 88, can be withdrawn from the tool, turned over and reinserted in the same manner as was done initially. The second group of dressed wires, which in this instant are the drain wires 83, are placed over the second row of contacts 86 in alignment with slots 90. Once more the movable assembly is brought down, pushing the wires into the slots thereby terminating such. The ribbon coaxial cable 74 has now been completely terminated to multi-contact connector 76 in just two crimping operations. The cable illustrated in the drawings contains a total of 30 wires, 15 signal wires 78 and the same number of drain wires 83. Clearly, the number of wires is of no material importance with respect to the novelty of the present invention; i.e., any number can be terminated simultaneously.

At the outset it was noted that the tool 10 is just one type of press which can be used. The novelty lies in the two assemblies, the stationary assembly 20 and the movable assembly 28 and the tool is simply a means for moving one assembly with respect to the other.

The various elements of the present invention have been described as such were made; e.g., the plates 58 and 60 were made as individual pieces. Clearly they could be made as one piece. Other such modifications will have already occurred to the reader. For that reason, the above specification describes what appears to be at this time the preferred method of making the present invention and the preferred use thereof and no unnecessary limitations are to be inferred therefrom.

What is claimed is:

1. An assembly for staking a plurality of parallel wires to a connector having a wire-receiving section and a housing portion and further said wire-receiving section having two rows of wire-in-slot blade contacts with the slot openings in one row facing in a diametric direction relative to the slot openings in the other row, said assembly being positionable in a tool having a base and movable means above the base for vertical reciprocal movement, said assembly comprising:

a. a staker plate assembly comprising three plates each having a plurality of teeth depending from the bottom edges, said plates being positioned front to rear on the movable means with said teeth on each plate being in alignment with the teeth on the other plates, further, said assembly having means to space each plate one from the other predetermined distance; and b. a stationary assembly mounted on the base and comprising a connector receiving platform having a first and second level, said first level being in alignment with the staker plate assembly and adapted to receive thereover the wire-receiving portion of the connector, said second level lying behind and below the first level and adapted to receive the housing portion of the connector, and further said stationary assembly having retaining and centering means comprising a first rib member extending across the front of the first level and adapted to receive thereagainst the rear face of the connector, and a second rib member extending across the first level immediately behind and displaced below the first rib member, said second rib member having teeth spaced along the top edge thereof and adapted to receive thereon the contact-containing cavities so as to center the connector on the stationary assembly.

* * * * *